United States Patent
Tarui et al.

(10) Patent No.: US 8,026,160 B2
(45) Date of Patent: Sep. 27, 2011

(54) SEMICONDUCTOR DEVICE AND SEMICONDUCTOR DEVICE MANUFACTURING METHOD

(75) Inventors: Yoichiro Tarui, Tokyo (JP); Ken-ichi Ohtsuka, Tokyo (JP); Masayuki Imaizumi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 895 days.

(21) Appl. No.: 12/063,875

(22) PCT Filed: May 9, 2006

(86) PCT No.: PCT/JP2006/309307
§ 371 (c)(1),
(2), (4) Date: Feb. 15, 2008

(87) PCT Pub. No.: WO2007/029375
PCT Pub. Date: Mar. 15, 2007

(65) Prior Publication Data
US 2009/0261348 A1 Oct. 22, 2009

(30) Foreign Application Priority Data
Sep. 8, 2005 (JP) .................................. 2005-260182

(51) Int. Cl.
*H01L 21/425* (2006.01)
(52) U.S. Cl. . 438/526; 438/140; 438/508; 257/E21.057; 257/E29.012; 257/E21.043
(58) Field of Classification Search .................. 257/77, 257/492–496, E21.056, E21.057, E29.012; 438/140, 498, 521, 526
See application file for complete search history.

(56) References Cited

U.S. PATENT DOCUMENTS

| | | | | |
|---|---|---|---|---|
| 5,449,925 A | * | 9/1995 | Baliga et al. | 257/77 |
| 5,705,406 A | * | 1/1998 | Rottner et al. | 438/495 |
| 5,712,502 A | * | 1/1998 | Mitlehner et al. | 257/341 |
| 5,801,836 A | * | 9/1998 | Bakowski et al. | 257/487 |
| 5,914,500 A | * | 6/1999 | Bakowski et al. | 257/77 |
| 5,932,894 A | * | 8/1999 | Bakowski et al. | 257/76 |
| 5,967,795 A | * | 10/1999 | Bakowsky et al. | 438/494 |
| 5,977,605 A | * | 11/1999 | Bakowsky et al. | 257/496 |

(Continued)

FOREIGN PATENT DOCUMENTS
JP        11-330496        11/1999
(Continued)

OTHER PUBLICATIONS

B. Jayant Baliga, "Power Semiconductor Devices", pp. 111-113 (1995).

*Primary Examiner* — David Vu
*Assistant Examiner* — Earl Taylor
(74) *Attorney, Agent, or Firm* — Leydig, Voit & Mayer, Ltd.

(57) ABSTRACT

In a semiconductor device using a SiC substrate, a Junction Termination Edge (JTE) layer is hardly affected by fixed charge so that a stable dielectric strength is obtained. A semiconductor device according to a first aspect of the present invention includes a SiC epi-layer having n type conductivity, an impurity region in a surface of the SiC epi-layer and having p type conductivity, and JTE layers adjacent to the impurity region, having p type conductivity, and having a lower impurity concentration than the impurity region. The JTE layers are spaced by a distance from an upper surface of the SiC epi-layer, and SiC regions having n type conductivity are present on the JTE layers.

10 Claims, 8 Drawing Sheets

U.S. PATENT DOCUMENTS

| | | | | |
|---|---|---|---|---|
| 6,002,159 | A * | 12/1999 | Bakowski et al. | 257/493 |
| 6,040,237 | A * | 3/2000 | Bakowski et al. | 438/521 |
| 6,242,784 | B1 * | 6/2001 | Zeng et al. | 257/409 |
| 6,362,026 | B2 * | 3/2002 | Zeng et al. | 438/140 |
| 6,373,076 | B1 * | 4/2002 | Alok et al. | 257/76 |
| 6,469,359 | B2 * | 10/2002 | Bakowski et al. | 257/487 |
| 6,552,363 | B2 * | 4/2003 | Sridevan | 257/77 |
| 6,667,495 | B2 * | 12/2003 | Friedrichs et al. | 257/77 |
| 6,703,276 | B2 * | 3/2004 | Alok et al. | 438/268 |
| 6,844,251 | B2 * | 1/2005 | Shenai et al. | 438/571 |
| 6,914,280 | B2 | 7/2005 | Asano et al. | |
| 7,541,660 | B2 * | 6/2009 | Schulze et al. | 257/492 |
| 7,768,092 | B2 * | 8/2010 | Harris et al. | 257/471 |
| 2001/0007369 | A1 * | 7/2001 | Zeng et al. | 257/483 |
| 2001/0050369 | A1 * | 12/2001 | Zeng et al. | 257/77 |
| 2002/0017647 | A1 * | 2/2002 | Bakowski et al. | 257/77 |
| 2002/0094667 | A1 * | 7/2002 | Bakowski et al. | 438/526 |
| 2002/0139992 | A1 * | 10/2002 | Kumar et al. | 257/134 |
| 2004/0135153 | A1 * | 7/2004 | Ryu et al. | 257/77 |
| 2006/0118812 | A1 * | 6/2006 | Ohtsuka et al. | 257/107 |
| 2006/0261347 | A1 * | 11/2006 | Ryu et al. | 257/77 |
| 2007/0246791 | A1 * | 10/2007 | Schulze et al. | 257/495 |

FOREIGN PATENT DOCUMENTS

| | | |
|---|---|---|
| JP | 2000-150875 | 5/2000 |
| JP | 2002-507325 A | 3/2002 |
| JP | 2004-140184 | 5/2004 |

* cited by examiner

SEMICONDUCTOR DEVICE AND SEMICONDUCTOR DEVICE MANUFACTURING METHOD

TECHNICAL FIELD

The present invention relates to a semiconductor device and a semiconductor device manufacturing method, and particularly to a semiconductor device and a semiconductor device manufacturing method in which a JTE layer is formed in a SiC substrate.

BACKGROUND ART

There are conventional power semiconductor devices using SIC substrates, such as Schottky diodes, pn diodes, MOSFETs, etc. Such power semiconductor devices introduce various types of termination structures in order to prevent the concentration of an electric field at the pn junction. Such of termination structures include the JTE (Junction Termination Edge) structure (see Non-Patent Document 1, for example).

Characteristically, the JTE structure can be formed easily by ion implantation. Also, the JTE structure is easy to design, by setting the carrier concentration of the JTE layer such that the JTE layer is completely depleted at the time of dielectric breakdown.

Also, there are techniques for reducing the electric-field strength at the JTE surface by covering the pn junction and JTE with a third layer (Patent Document 1,for example).

Non-Patent Document 1: B. Jayant Baliga, "POWER SEMICONDUCTOR DEVICES", pp. 111-113.

Patent Document 1: Japanese Patent Application Laid-Open No. 2002-507325

DISCLOSURE OF THE INVENTION

Problems to be Solved by the Invention

The JTE layer of Non-Patent Document 1 is susceptible to charges etc. (especially, fixed charges) around the interface between the JTE layer and a protective film formed over the JTE layer. When the amount of fixed charges around the interface varies, the dielectric breakdown voltage of the power semiconductor device is considerably lowered. Also, different conditions for the formation of the protective film greatly vary the amount of fixed charges around the interface, which greatly varies the dielectric breakdown voltage of the power semiconductor device.

That is, the power semiconductor device having the JTE structure of Non-Patent Document 1 involves difficulties in obtaining a stable dielectric breakdown voltage.

Patent Document 1 discloses a JTE structure that is less likely to be affected by the amount of fixed charges around the JTE interface in a power semiconductor device using a SiC substrate (i.e. the pn junction and JTE are covered by a third layer).

However, in the JTE structure of Patent Document 1, the third layer is not always formed of n type SiC, and it cannot solve the problem that the amount of fixed charges around the interface between the third layer and a protective film formed thereover considerably varies depending on the conditions for formation of the protective film. Also, the third layer and the SiC substrate do not electrically connect to each other, and so the potential of the third layer is not stable. Accordingly, an object of the present invention is to provide a semiconductor device and its manufacturing method in which, even when a semiconductor device using a SiC substrate has a JTE structure (a JTE layer), the JTE layer is hardly affected by fixed charges so that a stable dielectric strength is obtained.

Means for Solving the Problems

According to claim 1 of the present invention, a semiconductor device includes: a SiC region having n type conductivity; an impurity layer formed in a surface of said SiC region and having p type conductivity; and a JTE layer formed adjacent to said impurity layer and having p type conductivity, said JTE layer having a lower impurity concentration than said impurity layer, wherein said JTE layer is formed in a position that is a given distance apart from the upper surface of said SiC region, and a region having n type conductivity is formed on said JTE layer.

A semiconductor device of claim 2 includes: a SiC region having n type conductivity; a first impurity layer formed in a surface of said SiC region and having p type conductivity; a JTE layer formed adjacent to said first impurity layer in the surface of said SiC region and having p type conductivity, said JTE layer having a lower impurity concentration than said first impurity layer; and a second impurity layer formed at least on said JTE layer and having n type conductivity.

A semiconductor device manufacturing method of claim 4 includes the steps of: (A) forming an impurity layer having p type conductivity in a surface of a SiC region having n type conductivity; and (B) applying an ion implantation to said SiC region in a region adjacent to said impurity layer, so as to form a first JTE layer adjacent to said impurity layer and having a lower impurity concentration than said impurity layer, wherein said step (B) applies said ion implantation at varied energies such that said first JTE layer is formed from a first depth in said SiC region to a second depth that does not reach the surface of said SiC region.

A semiconductor device manufacturing method of claim 6 includes the steps of: (A) forming an impurity layer having p type conductivity in a surface of a SiC region having n type conductivity; and (B) applying an ion implantation to said SiC region in a region adjacent to said impurity layer, so as to form a first JTE layer adjacent to said impurity layer and having a lower impurity concentration than said impurity layer, wherein said step (B) applies said ion implantation at varied energies to effect a p type ion implantation from a first depth in said SiC region to the surface of said SiC region, and then to effect an n type ion implantation from the surface of said SiC region to a second depth of said SiC region, so as to form said first JTE layer.

A semiconductor device manufacturing method of claim 8 includes the steps of: (a) forming a first impurity layer having p type conductivity in a surface of a SiC region having n type conductivity; (b) forming a first JTE layer adjacent to said first impurity layer in the surface of said SiC region, said first JTE layer having a lower impurity concentration than said first impurity layer; (c) applying an epitaxial growth using a given dopant to form an epi-film having n type conductivity on the upper surface of said SiC region; and (d) removing a given portion of said epi-film such that a second impurity layer having n type conductivity remains at least on said first JTE layer.

A semiconductor device manufacturing method of claim 10 includes the steps of: (a) forming a first impurity layer having p type conductivity in a surface of a SiC region having n type conductivity; (b) forming a first JTE layer adjacent to said first impurity layer in the surface of said SiC region, said first JTE layer having a lower impurity concentration than said first impurity layer; (c) applying an epitaxial growth using a given dopant to form an epi-film having n type conductivity on the upper surface of said SiC region; (d) removing a given portion of said epi-film such that a second impurity layer having n type conductivity remains at least on said first JTE layer; and (e) applying an n type ion implantation to said second impurity layer.

A semiconductor device manufacturing method of claim 12 includes the steps of: (a) forming a first impurity layer having p type conductivity in a surface of a SiC region having n type conductivity; (b) forming a first JTE layer adjacent to said first impurity layer in the surface of said SiC region, said first JTE layer having a lower impurity concentration than said first impurity layer; (c) applying an epitaxial growth using a given dopant to form an epi-film having p type conductivity on the upper surface of said SiC region; (d) removing a given portion of said epi-film such that a second impurity layer having p type conductivity remains at least on said first JTE layer; and (e) applying an n type ion implantation to said second impurity layer to make said second impurity layer n type.

EFFECTS OF THE INVENTION

The semiconductor device of claim 1 of the present invention includes: a SiC region having n type conductivity; an impurity layer formed in a surface of said SiC region and having p type conductivity; and a JTE layer formed adjacent to said impurity layer and having p type conductivity, said JTE layer having a lower impurity concentration than said impurity layer, wherein said JTE layer is formed in a position that is a given distance apart from the upper surface of said SiC region, and a region having n type conductivity is formed on said JTE layer, whereby a semiconductor device having a so-called nMOS capacitor structure is obtained when a protective film is formed over the JTE layer. Accordingly, even when conditions for the formation of the protective film vary, the JTE layer is hardly affected by the variation of fixed charge density caused by the variation of formation conditions. This stabilizes the dielectric breakdown voltage (withstand voltage value) of the semiconductor device.

The semiconductor device of claim 2 of the present invention includes: a SiC region having n type conductivity; a first impurity layer formed in a surface of said SiC region and having p type conductivity; a JTE layer formed adjacent to said first impurity layer in the surface of said SiC region and having p type conductivity, said JTE layer having a lower impurity concentration than said first impurity layer; and a second impurity layer formed at least on said JTE layer and having n type conductivity, whereby a semiconductor device having a so-called nMOS capacitor structure is obtained when a protective film is formed to cover the second impurity layer over the JTE layer. Accordingly, even when conditions for the formation of the protective film vary, the JTE layer is hardly affected by the variation of fixed charge density caused by the variation of formation conditions. This stabilizes the dielectric breakdown voltage (withstand voltage value) of the semiconductor device.

The semiconductor device manufacturing method of claim 4 of the present invention includes the steps of: (A) forming an impurity layer having p type conductivity in a surface of a SiC region having n type conductivity; and (B) applying an ion implantation to said SiC region in a region adjacent to said impurity layer, so as to form a first JTE layer adjacent to said impurity layer and having a lower impurity concentration than said impurity layer, wherein said step (B) applies said ion implantation at varied energies such that said first JTE layer is formed from a first depth in said SiC region to a second depth that does not reach the surface of said SiC region, whereby the semiconductor device of claim 1 can be manufactured easily just by varying the ion implant energy, e.g. from high to low.

The semiconductor device manufacturing method of claim 6 of the present invention includes the steps of: (A) forming an impurity layer having p type conductivity in a surface of a SiC region having n type conductivity; and (B) applying an ion implantation to said SiC region in a region adjacent to said impurity layer, so as to form a first JTE layer adjacent to said impurity layer and having a lower impurity concentration than said impurity layer, wherein said step (B) applies said ion implantation at varied energies to effect a p type ion implantation from a first depth in said SiC region to the surface of said SiC region, and then to effect an n type ion implantation from the surface of said SiC region to a second depth of said SiC region, whereby the semiconductor device of claim 1 can be manufactured easily.

The semiconductor device manufacturing method of claim 8 of the present invention includes the steps of: (a) forming a first impurity layer having p type conductivity in a surface of a SiC region having n type conductivity; (b) forming a first JTE layer adjacent to said first impurity layer in the surface of said SiC region, said first JTE layer having a lower impurity concentration than said first impurity layer; (c) applying an epitaxial growth using a given dopant to form an epi-film having n type conductivity on the upper surface of said SiC region; and (d) removing a given portion of said epi-film such that a second impurity layer having n type conductivity remains at least on said first JTE layer, whereby the semiconductor device of claim 2 can be manufactured.

The semiconductor device manufacturing method of claim 10 of the present invention includes the steps of: (a) forming a first impurity layer having p type conductivity in a surface of a SiC region having n type conductivity; (b) forming a first JTE layer adjacent to said first impurity layer in the surface of said SiC region, said first JTE layer having a lower impurity concentration than said first impurity layer; (c) applying an epitaxial growth using a given dopant to form an epi-film having n type conductivity on the upper surface of said SiC region; (d) removing a given portion of said epi-film such that a second impurity layer having n type conductivity remains at least on said first JTE layer; and (e) applying an n type ion implantation to said second impurity layer, whereby the semiconductor device of claim 2 can be manufactured.

The semiconductor device manufacturing method of claim 12 of the present invention includes the steps of: (a) forming a first impurity layer having p type conductivity in a surface of a SiC region having n type conductivity; (b) forming a first JTE layer adjacent to said first impurity layer in the surface of said SiC region, said first JTE layer having a lower impurity concentration than said first impurity layer; (c) applying an epitaxial growth using a given dopant to form an epi-film having p type conductivity on the upper surface of said SiC region; (d) removing a given portion of said epi-film such that a second impurity layer having p type conductivity remains at least on said first JTE layer; and (e) applying an n type ion implantation to said second impurity layer to make said second impurity layer n type, whereby the semiconductor device of claim 2 can be manufactured.

Objects, features, aspects and advantages of the present invention will become more apparent from the following detailed description and the accompanying drawings.

DESCRIPTION OF THE REFERENCE CHARACTERS

Figure 1:
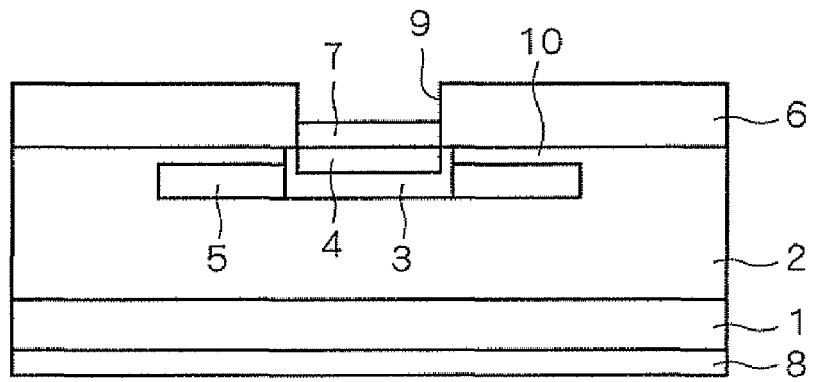
FIG. 1 A cross-sectional view illustrating the structure of a semiconductor device according to a first preferred embodiment.

1 SiC substrate: 2 SiC epi-layer: 3 (first) impurity layer: 4 ohmic contact region: 5 JTE layer: 6 protective film: 7 anode electrode: 8 cathode electrode: 9, 29 opening: 10 n type SiC region: 15 epi-channel layer: 16 gate insulating film: 17 gate electrode: 18 insulating film: 19 ion-implanted region: 21 source electrode: 22 drain electrode: 23 back electrode: 25 second impurity layer.

BEST MODE FOR CARRYING OUT THE INVENTION

The present invention will now be specifically described referring to the drawings that illustrate the preferred embodiments.

<First Preferred Embodiment>

FIG. 1 is a cross-sectional view illustrating the structure of a semiconductor device (specifically, a pn diode) according to this preferred embodiment.

As shown in FIG. 1, a SiC epi-layer (which can be regarded as a SiC region) 2 is formed on a first main surface of a SiC substrate 1. Here, the SiC substrate 1 has n type conductivity. The SiC epi-layer 2 has n− type conductivity.

An impurity layer 3 is formed in a given region in the surface of the SiC epi-layer 2. The impurity layer 3 has p type conductivity. An ohmic contact region 4 is formed in the surface of the impurity layer 3. The ohmic contact region 4 has p+ type conductivity.

JTE layers 5 are formed adjacent to the impurity layer 3. More specifically, the JTE layers 5 are formed adjacent to the impurity layer 3 to surround the impurity layer 3.

The JTE layers 5 have p type conductivity. The impurity concentration of the JTE layers 5 is lower than the impurity concentration of the impurity layer 3. Also, as shown in FIG. 1, the JTE layers 5 are formed in positions that are a given distance apart from the upper surface of the SiC epi-layer 2. Accordingly, n type SiC regions 10 exist on the JTE layers 5.

A protective film 6 is formed on a first main surface of the SiC epi-layer 2. The protective film 6 has an opening 9 above the ohmic contact region 4. An anode electrode 7 is formed in the opening 9. The anode electrode 7 connects to the impurity layer 3 through the ohmic contact region 4.

A cathode electrode 8 is formed on a second main surface of the SiC substrate 1. Accordingly, as can be seen from FIG. 1, the cathode electrode 8 is located opposite the anode electrode 7.

Next, a method of manufacturing the semiconductor device (specifically, a pn diode) of this preferred embodiment will be described referring to the cross-sectional views illustrating the process steps.

Figure 2:
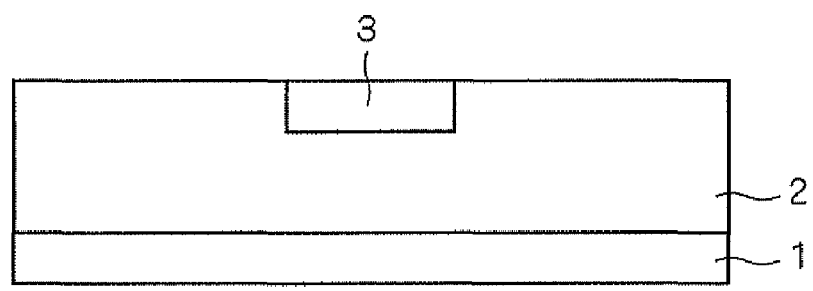
FIG. 2 A cross-sectional view illustrating a process of manufacturing the semiconductor device of the first preferred embodiment.

First, an epitaxial growth using given dopant is applied to the first main surface of the n type SiC substrate 1. Thus, as shown in FIG. 2, the n− type SiC epi-layer (which can be regarded as a SiC region) 2 is formed on the first main surface of the SiC substrate 1.

Next an ion implantation is applied to a given region of the first main surface of the SiC epi-layer 2. Thus, as shown in FIG. 2, the p type impurity layer 3 is formed in a given region in the surface of the SiC epi-layer 2. This ion implantation is conducted while varying the implant energy in a step-by-step manner, e.g. from high to low.

Figure 3:
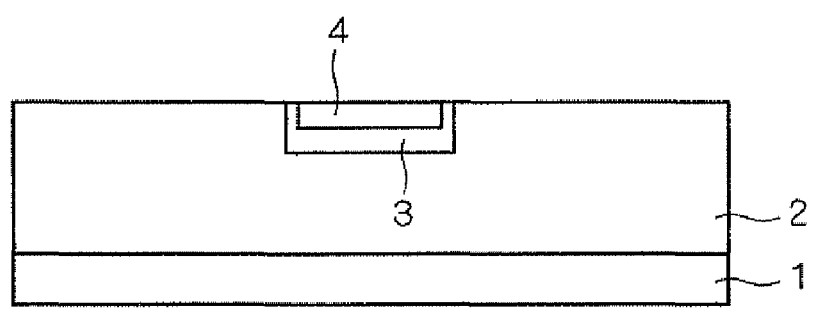
FIG. 3 A cross-sectional view illustrating the process of manufacturing the semiconductor device of the first preferred embodiment.

Next, a further ion implantation is applied to the region in which the impurity layer 3 has been formed. Thus, as shown in FIG. 3, the p+ type ohmic contact region 4, having a higher concentration than the impurity layer 3, is formed in the surface of the impurity layer 3. This ion implantation is conducted while varying the implant energy in a step-by-step manner, e.g. from high to low.

Figure 4:
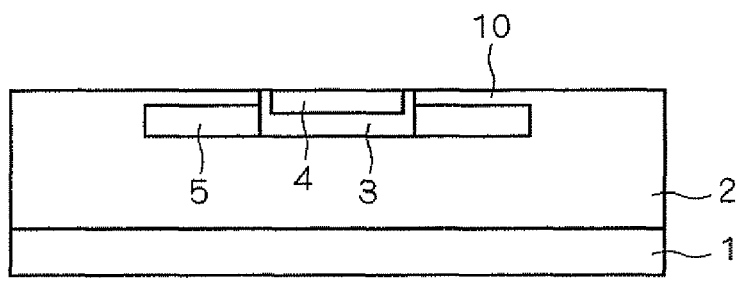
FIG. 4 A cross-sectional view illustrating the process of manufacturing the semiconductor device of the first preferred embodiment.

Next, an ion implantation is applied to regions adjacent to the impurity layer 3. Thus, as shown in FIG. 4, the JTE layers 5 are formed adjacent to the impurity layer 3. As mentioned earlier, the JTE layers 5 have p type conductivity. The impurity concentration of the JTE layers 5 is lower than the impurity concentration of the impurity layer 3.

The ion implantation for the formation of the JTE layers 5 is conducted while varying the implant energy in a step-by-step manner, e.g. from high to low. Ions are implanted deeper as the implant energy is higher, and then the JTE layers 5 are formed deeper.

Accordingly, with varied ion implant energy, the JTE layers 5 can be formed from a first depth in the SiC epi-layer 2 to a second depth that does not reach the surface of the SiC epi-layer 2, by controlling the lower limit of the implant energy. That is, it is possible to form a structure in which the n type SiC regions 10 exist (remain) on the JTE layers 5 (FIG. 4).

In another method of forming the JTE layers 5, a p type ion implantation is conducted (that is, p type regions (JTE layers 5) are formed) from a first depth to the surface of the SiC epi-layer 2, by varying the ion implant energy in a step-by-step manner, and then an n type ion implantation is conducted to form the n type SiC regions 10 of a given concentration from the surface of the SiC epi-layer 2 to a second depth, by varying the n type ion implant energy in a step-by-step manner.

These ion implantation steps are followed by an activating annealing. This electrically activates the impurities that have been ion-implanted in the implantation steps. The activating annealing also restores crystallinity of the ion-implanted regions.

Figure 5:
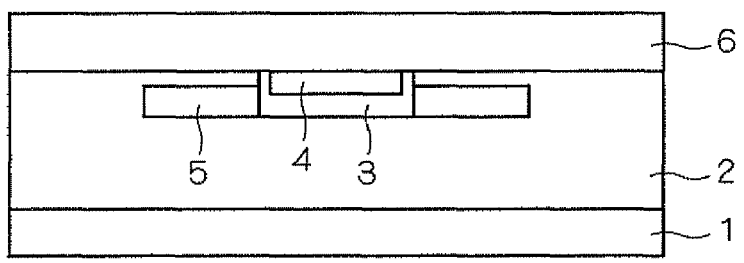
FIG. 5 A cross-sectional view illustrating the process of manufacturing the semiconductor device of the first preferred embodiment.
Figure 6:
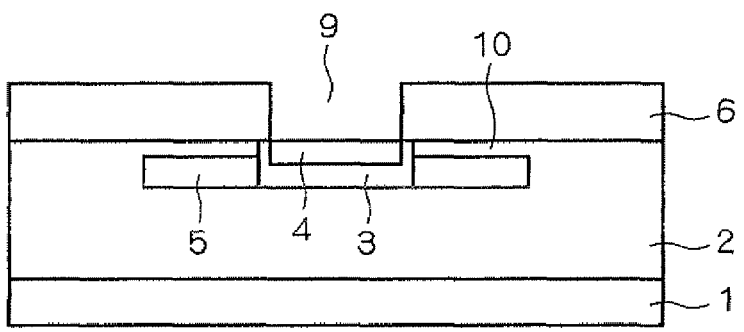
FIG. 6 A cross-sectional view illustrating the process of manufacturing the semiconductor device of the first preferred embodiment.

After that, as shown in FIG. 5, the protective film (an insulating film of, e.g. SiO2) 6 is formed on the first main surface of the SiC epi-layer 2. Then, as shown in FIG. 6, the opening 9 is formed in the protective film 6. As can be seen from FIG. 6, the ohmic contact region 4 is exposed at the bottom of the opening 9.

After that, the anode electrode 7 is formed such that it connects to the ohmic contact region 4 exposed at the bottom of the opening 9 (FIG. 1). Also, the cathode electrode 8 is formed on the second main surface of the SiC substrate 1 (FIG. 1).

The semiconductor device of the preferred embodiment is completed through these process steps.

In this preferred embodiment the p type JTE layers 5 are formed within the n type SiC epi-layer 2, without being exposed in the surface of the n type SiC epi-layer 2. Accordingly, the structure has the n type SiC regions 10 on the p type JTE layers 5.

Suppose conditions for the formation of the protective film 6 over the JTE layers 5 varied and the amount of fixed charges occurring between the JTE layers 5 and the protective film 6 varied. However, the JTE layers 5 are hardly affected by the fixed charges, thanks to the above-described structure. It is thus possible to provide a semiconductor device having a stable dielectric strength.

This effect has been confirmed by the experimental results shown below. The experiment will be described in detail.

The protective film 6, which is provided to protect the surface and usually made of SiO2, is formed on the surface of the SiC epi-layer 2 in which the JTE layers 5 reside. With this structure, a large number of interface states are formed between the SiC epi-layer 2 and the protective film 6. Then, when charges are trapped in the interface states, the JTE layers 5 are affected thereby, and the dielectric breakdown voltage of the semiconductor device will become smaller than the designed value as mentioned earlier.

Figure 7:
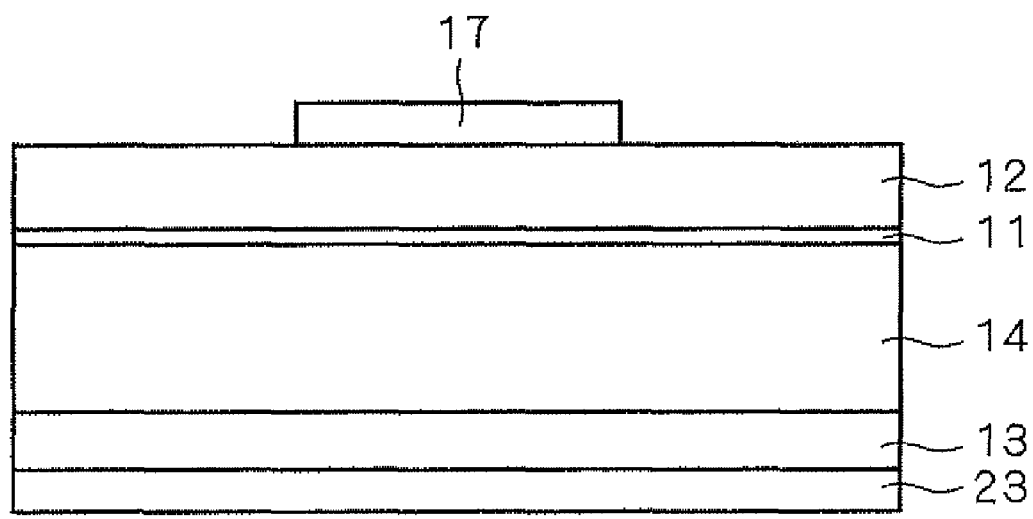
FIG. 7 A cross-sectional view illustrating a MOS capacitor structure.

Accordingly, the inventors conducted an experiment to evaluate the interface between the SiC film and SiO2 film. For the experiment, MOS capacitors as shown in FIG. 7 were made. More specifically, a p type MOS capacitor and an n type MOS capacitor were made.

Now, the n type MOS capacitor (hereinafter referred to as nMOS capacitor) was structured as shown below.

In FIG. 7, an n type SiC epi-layer 14 is formed by epitaxial growth on an n+ type SiC substrate 13. A thermal oxide film 11 of SiO2 is formed on the SiC layer 14, and a SiO2 film 12 is formed by CVD on the thermal oxide film 11. A back electrode 23 is formed on the back of the SiC substrate 13, and a gate electrode 17 is formed on the SiO2 film 12.

Thus, the nMOS capacitor can be regarded as a structure in which an oxide film and an n type SiC region connect to each other between the gate electrode 17 and the back electrode 23.

On the other hand, the p type MOS capacitor (hereinafter referred to as pMOS capacitor) was structure as shown below.

In FIG. 7, a p type SiC epi-layer 14 is formed by epitaxial growth on a p+ type SiC substrate 13. A thermal oxide film 11 of SiO2 is formed on the SiC layer 14, and a SiO2 film 12 is formed by CVD on the thermal oxide film 11. A back electrode 23 is formed on the back of the SiC substrate 13, and a gate electrode 17 is formed on the SiO2 film 12.

Thus, the pMOS capacitor can be regarded as a structure in which an oxide film and a p type SiC region connect to each other between the gate electrode 17 and the back electrode 23.

With the MOS capacitors thus structured, the inventors conducted an experiment on the variation of C (Capacitance)–V (Voltage) characteristic, by varying conditions for the formation of the thermal oxide film 11 and the SiO2 film 12. Examples of the results of the experiment are shown in FIGS. 8 and 9.

Figure 8:
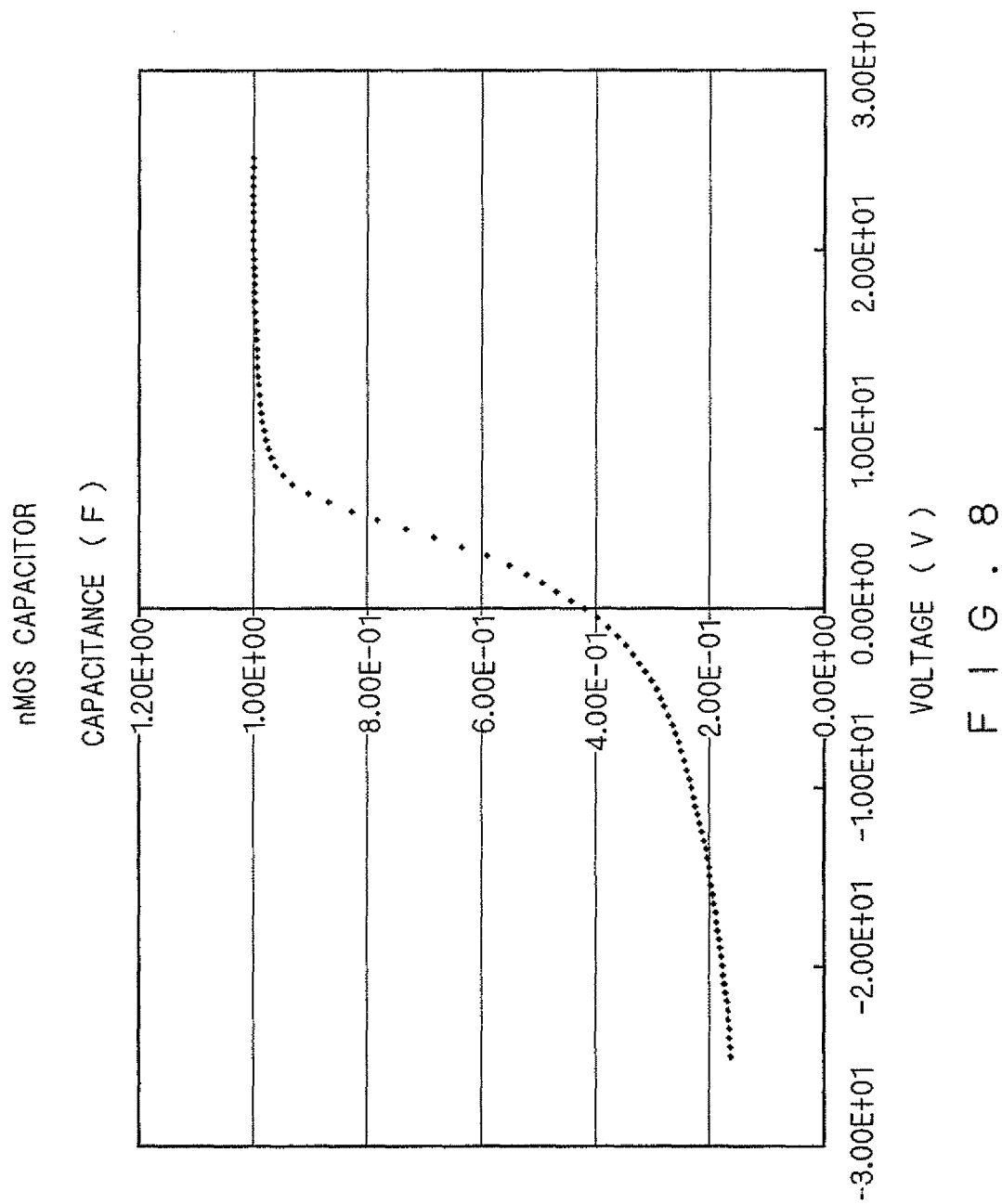
FIG. 8 A diagram showing the results of an experiment on the C-V characteristic of an nMOS capacitor.
Figure 9:
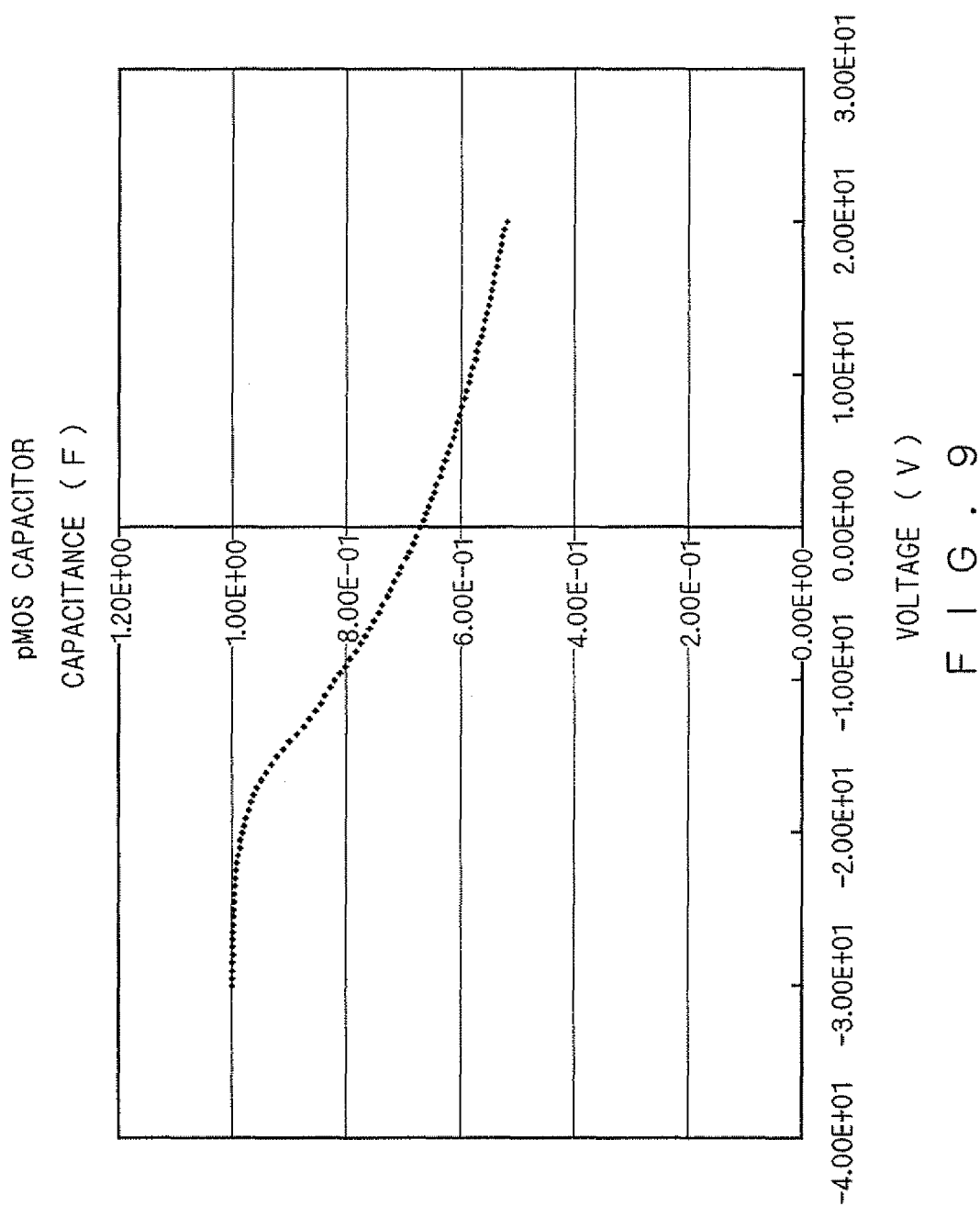
FIG. 9 A diagram showing the results of an experiment on the C-V characteristic of a pMOS capacitor.

The experimental data as shown in FIGS. 8 and 9 was obtained by varying conditions of the formation of the thermal oxide film 11 and the SiO2 film 12, and the fixed charge density were obtained from the experimental data. The fixed charge density were calculated from flat-band voltage shift on the basis of the experimental data.

As a result, it was seen that the fixed charge density of the nMOS capacitor varied in a range below $1\times10^{11}/cm^2$ when conditions for the formation of the films 11 and 12 were varied. On the other hand, the fixed charge density of the pMOS capacitor varied in the range of $2\times10^{12}$ to $6\times10^{12}/cm^2$.

The results show the conclusion below. That is, the fixed charge density of the nMOS capacitor is lower by one order of magnitude or more, as compared with that of the pMOS capacitor. This conclusion does not change even when conditions for the formation of the films 11 and 12 are changed.

Here, the impurity concentration of the JTE layers 5 is approximately up to $10^{13}/cm^2$.

Figure 10:
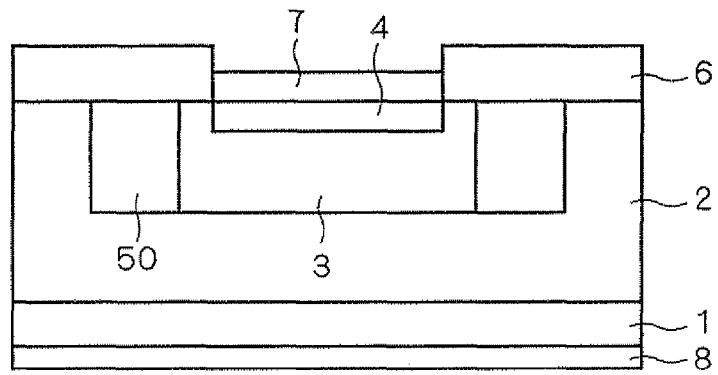
FIG. 10 A cross-sectional view illustrating the structure of a semiconductor device having a pMOS capacitor structure.

Thus, it can be said that the JTE layers 5 are considerably affected by the variation of the fixed charge density when the device adopts a pMOS-capacitor-like structure with the JTE layers 5 (i.e. a structure as shown in FIG. 10 in which the SiO2 protective film 6 is formed directly on the upper surface of the p type JTE layers 50 of SiC) in which the fixed charge density varies on approximately the same order when conditions for the formation of the films 11 and 12 are varied.

On the other hand, it can be said that the JTE layers 5 are hardly affected by the variation of the fixed charge density when the device adopts an nMOS-capacitor-like structure with the JTE layers 5 (i.e. the structure as shown in FIG. 1 in which the n type SiC regions 10 exist on the p type JTE layers 5, and the SiO2 protective film 6 is formed on the SiC regions 10) in which the variation of fixed charge density is one order of magnitude lower when conditions for the formation of the films 11 and 12 are varied.

These results can be explained with conventionally known facts and band structures.

Figure 11:
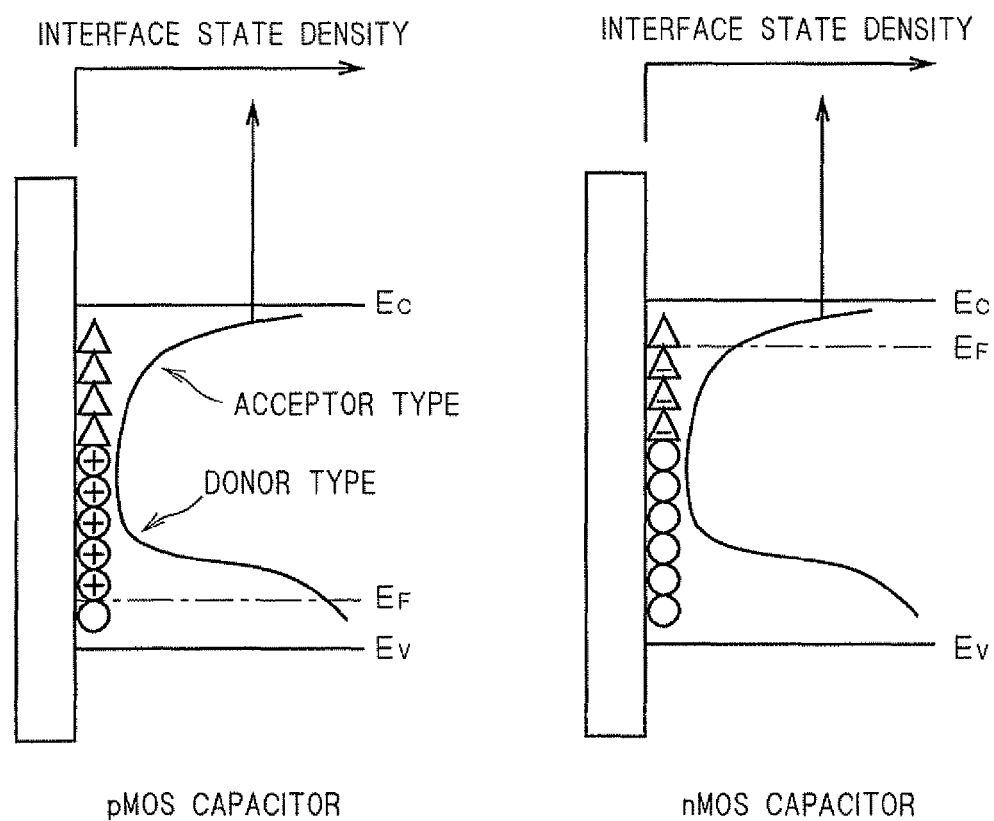
FIG. 11 A diagram illustrating MOS capacitor band structures.

In the band structures shown in FIG. 11, it is generally known that the band gap of SiC, (Ec-Ev), is large, that a large number of interface states exist in the band gap, that its density is smaller around the mid-gap, and that the density increases toward the conduction band (Ec) and the valence band (Ev).

It is also known that charges trapped in deep interface states are not released at room temperature, and so they behave substantially like fixed charges, that the interface states in the SiC band gap are acceptor type on the conduction band (Ec) side from the mid-gap, and are donor type on the valence band (Ev) side, and that a larger number of donor-type energy levels exist than acceptor-type energy levels.

Now, with the acceptor-type interface states, negative fixed charges reside in the interface states when they are smaller than the Fermi energy (Ef). The interface states are neutral when they are larger than the Fermi energy (Ef).

Also, the donor-type interface states are neutral when they are smaller than the Fermi energy (Ef). When larger than the Fermi energy (Ef), positive fixed charges reside in the interface states.

Now, the Fermi energy Ef exists between the conduction band (Ec) and the valence band (Ev). Particularly, in the case of a pMOS capacitor, the Fermi energy Ef is formed closer to the valence band (Ev). With an nMOS capacitor, the Fermi energy Ef is formed closer to the conduction band (Ec).

From the conventionally known facts and band structures, it is understood that the pMOS capacitor effectively involves a larger number of positive fixed charges, and the nMOS capacitor effectively somewhat involves negative fixed charges.

It is understood that the discussion agrees with the experimental results.

With the experimental results, it is thought that the fixed charge density varies in a given range when conditions for the formation of the films 11 and 12 are varied because the interface states between the SiC epi-layer 14 and the films 11 and 12 vary due to the variation of formation conditions.

Thus, with the pMOS-capacitor-like structure having JTE layers 5 as shown in FIG. 10, for example, the JTE layers 50 are considerably affected by the variation of fixed charge density caused when conditions for the formation of the protective film 6 are varied. The dielectric breakdown voltage of the semiconductor device therefore easily varies.

In contrast, with the nMOS-capacitor-like structure having JTE layers 5 as shown in FIG. 1, for example, the JTE layers 5 are hardly affected by the variation of fixed charge density when conditions for the formation of the protective film 6 are varied. The dielectric breakdown voltage (withstand voltage value) of the semiconductor device is therefore stable.

Thus, the semiconductor device of this preferred embodiment provides stable dielectric strength, because the JTE layers 5 are hardly affected by the variation of the amount of fixed charges occurring between the JTE layers 5 and the protective film 6, when conditions for the formation of the protective film 6 over the JTE layers 5 are varied, for example.

Also, in the process of manufacturing the semiconductor device having the JTE layers 5 thus constructed, an ion implantation is applied to the SiC epi-layer 2 to form the JTE layers 5. In this ion implantation, the ion implant energy is varied in a step-by-step manner.

Accordingly, by controlling the ion implant energy, the JTE layers 5 can be formed from a first depth in the SiC epi-layer 2 to a second depth that does not reach the surface of the SiC epi-layer 2. That is, it is possible to form a structure in which the n type SiC regions 10 exist on the JTE layers 5.

In the process of forming the JTE layers 5 (i.e. in the ion implantation for the formation of the JTE layers 5), it is preferable to perform the ion implantation such that the impurity concentration Np and the depth Dp of the JTE layers (which can be regarded as a first JTE layer) 5 satisfy the following condition.

That is, it is preferable to perform the ion implantation such that the condition below is satisfied:

$$Np \times Dp = Npo \times Dpo + Nn \times Dn.$$

Wherein "Npo" is an optimum impurity concentration of the JTE layers 50 as shown in FIG. 10, for example (which can be regarded as a second JTE layer). That is, it is an optimum impurity concentration of the JTE layers 50 when the JTE layers 50 are formed to reach the surface of the SiC epi-layer 2 and there are no fixed charges between the SiC and protective film. The optimum impurity concentration refers to an impurity concentration that provides a maximum withstanding effect in terms of dielectric strength. "Npo" can be determined by experiment or simulation, for example.

"Dpo" is a depth of the JTE layers (which can be regarded as second JTE layer) 50 when the JTE layers 50 shown in FIG. 10, for example, have the impurity concentration "Npo". That is, it is a depth of the JTE layers 50 when the JTE layers 50 are formed to reach the surface of the SiC epi-layer 2.

"Nn" is the impurity concentration of the n type SiC regions 10 existing on the JTE layers (which can be regarded as first JTE layer) 5 in FIG. 1. "Dn" is the depth of the n type SiC regions 10 on the JTE layers (which can be regarded as first JTE layer) 5 in FIG. 1.

The equation above is derived on the basis of the idea that the optimum amount of carriers of the JTE layers 50 (i.e. Npo×Dpo×Area A) plus the amount of carriers due to the n type SiC regions 10 (i.e. Nn×Dn×Area A) as p type impurity provides the optimum amount of carriers of the JTE layers 5 of the preferred embodiment (i.e. Np×Dp×Area A). Wherein the Area A is equivalent in the individual terms.

Thus, the ion implantation is conducted to satisfy the equation. This provides the JTE layers 5 with a maximum withstanding effect in terms of dielectric strength. The semiconductor device fabricated under this condition provides a relation nearly equal to that of the equation.

For example, for the manufacture of a semiconductor device (pn diode) with a withstand voltage of 1200 to 1700 V, the ion implantation is preferably conducted such that the components have the values below.

That is, suppose the impurity concentration of the SiC epi-layer 2 is $5 \times 10^{15}$ to $2 \times 10^{16}/cm^3$ and its depth (thickness) is 7 to 15 µm. Also, suppose Npo=$2 \times 10^{17}/cm^3$ and Dpo=0.9 µm. Then, in FIG. 1, suppose the n type SiC regions 10 are formed with the impurity concentration Nn being $5 \times 10^{15}$ to $2 \times 10^{16}/cm^3$ (as is clear from the description of the structure, this is equal to the impurity concentration of the SiC epi-layer 2) and with its depth Dn being 0.1 to 0.3 µm.

In this case, to design the semiconductor device to satisfy Dp+Dn=0.9 µm, it is seen that the ion implantation is to be conducted such that the impurity concentration Np of the JTE layers 5 is 2.26 to $3.1 \times 3.1 \times 10^{17}/cm^3$ and its depth (thickness) is 0.8 to 0.6 µm.

The Npo and Dpo can be previously obtained by experiment or simulation, and the Nn, Dn, Np and Dp can be arbitrarily determined within the condition of the equation, according to the semiconductor device to be manufactured and the process. For example, when some terms are severely restricted because of the process or device design, other easier terms can be determined according to the conditional equation.

Also, it is difficult to form the JTE layers 5 with a small product of Np and Dp. Accordingly, when the product of Npo and Dpo is small, for example, the product of Nn and Dn can be set larger. This makes it possible to produce JTE layers 5 with a larger product of Np and Dp, facilitating the formation of the JTE layers 5.

Also, in the above-described another method for forming the JTE layers 5, i.e. in the method in which p type regions are formed from the surface of the SiC epi-layer 2 to a first depth by varying the implant energy step by step, and then the n type SiC regions 10 are formed from the surface of the SiC epi-layer 2 to a second depth by n type ion implantation by varying the implant energy step by step, the same discussion is viable with the impurity concentration of the n type ion implantation being "Nn1" and its thickness being "Dn1", as in the discussion about the formation of the JTE layers 5 through a p type ion implantation to the second depth not reaching the surface of the SiC epi-layer 2.

That is, it is preferable to perform the ion implantation such that the condition below is satisfied:

$$Np \times Dp = Npo \times Dpo + Nn1 \times Dn1.$$

This preferred embodiment has described a one-zone JTE structure as the structure of the JTE layers 5, but the same effects are obtained with a multiple-zone JTE structure in which the JTE layers 5 have a concentration distribution step by step from the first impurity layer 3 to the SiC epi-layer 2.

Also, a pn diode structure has been described as the device structure. However, the structure of the preferred embodiment (i.e. the structure in which the n type SiC regions 10 exist on the p type JTE layers 5, and the protective film 6 exists on the SiC regions 10) is applicable also to devices such as SiC Schottky diodes, SiC MOSFETs, etc. that have JTE layers 5 as a termination structure.

Second Preferred Embodiment

In the first preferred embodiment, the p type JTE layers 5 are formed within the n type SiC epi-layer 2, and the JTE layers 5 are not exposed from the upper surface of the SiC layer 2. That is, the n type SiC regions 10 exist between the JTE layers 5 and the upper surface of the SiC epi-layer 2.

On the other hand, the semiconductor device of this preferred embodiment provides a structure in which p type JTE layers are formed in the surface of an n type SiC epi-layer (which can be regarded as a SiC region, and, i.e. the JTE layers are exposed from the upper surface of the SiC epi-layer), and n type impurity layers (which can be regarded as a second impurity layer) are formed on the JTE layers.

In this preferred embodiment, a protective film is formed to cover the n type impurity layers. The preferred embodiment will be specifically described referring to the drawings.

Figure 12:
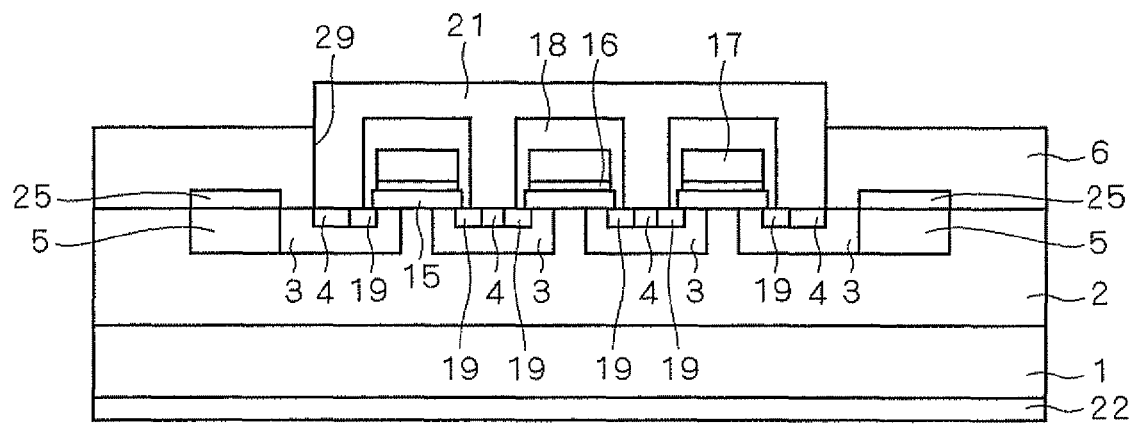
FIG. 12 A cross-sectional view illustrating the structure of a semiconductor device according to a second preferred embodiment.

FIG. 12 is a cross-sectional view illustrating the structure of a semiconductor device (specifically, an epi-channel MOSFET) according to this preferred embodiment.

As shown in FIG. 12, a SiC epi-layer (which can be regarded as a SiC region) 2 is formed on a first main surface of a SiC substrate 1. Here, the SiC substrate 1 has n type conductivity. The SiC epi-layer 2 has n− type conductivity.

First impurity layers 3 are formed in given regions in the surface of the SiC epi-layer 2. The first impurity layers 3 have p type conductivity. In cross-section, the first impurity layers 3 are arranged side by side in horizontal direction.

Ohmic contact regions 4 are formed in the surfaces of the first impurity layers 3. The ohmic contact regions 4 have p+ type conductivity.

Also, ion-implanted regions 19 are formed in the surfaces of the first impurity layers 3. The ion-implanted regions 19 have n+ type conductivity. The ion-implanted regions 19 are formed adjacent to the ohmic contact regions 4.

JTE layers 5 are formed adjacent to first impurity layers 3. More specifically, in cross-section, the JTE layers 5 are formed adjacent to the outermost ones of the first impurity layers 3 that are arranged in horizontal direction, and they thus surround the first impurity layers 3.

The JTE layers 5 have p type conductivity. The impurity concentration of the JTE layers 5 is lower than the impurity concentration of the first impurity layers 3. In this preferred embodiment, the JTE layers 5 are formed in the surface of the SiC epi-layer 2 (i.e. the JTE layers 5 are exposed from the upper surface of the SiC layer 2).

Second impurity layers 25 are formed on the JTE layers 5. The second impurity layers 25 have n type conductivity.

Also, epi-channel layers 15 are formed such that each epi-channel layer 15 extends from one ion-implanted region 19 in one first impurity layer 3 to one ion-implanted region 19 in the horizontally adjacent first impurity layer 3. The epi-channel layers 15 serve as MOSFET channels.

In cross-section, each epi-channel layer 15 is formed from an ion-implanted region 19 to another ion-implanted region 19 through the first impurity layer 3, the SiC epi-layer 2, and the first impurity layer 3. In FIG. 12, three epi-channel layers 15 are formed in this manner. The epi-channel layers 15 have n type conductivity.

Gate insulating films 16 are formed respectively on the epi-channel layers 15, and gate electrodes 17 are formed respectively on the gate insulating films 16. Furthermore, insulating films 18 are formed to respectively cover the layered structures composed of the epi-channel layers 15, gate insulating films 16, and gate electrodes 17.

A protective film 6 is formed on the first main surface of the SiC epi-layer 2, and it covers the second impurity layers 25. The protective film 6 has an opening 29. The layered structures described above, covered by the insulating films 18, reside in the opening 29.

Also, a source electrode 21 is formed in the opening 29, covering the layered structures covered by the insulating films 18. The source electrode 21 connects to the ohmic contact regions 4. Specifically, the source electrode 21 connects to the first impurity layers 3 through the ohmic contact regions 4.

A drain electrode 22 is formed on a second main surface of the SiC substrate 1, opposite to the source electrode 21.

In the semiconductor device (specifically, an epi-channel MOSFET) shown in FIG. 12, controlling the voltage applied to the gate electrodes 17 varies the depletion layers in the epi-channel layers 15. This causes current to flow between the source electrode 21 and the drain electrode 22 through the epi-channel layers 15.

Next, a method of manufacturing the semiconductor device (specifically, epi-channel MOSFET) of this preferred embodiment will be described, referring to the cross-sectional views illustrating the process steps.

Figure 13:
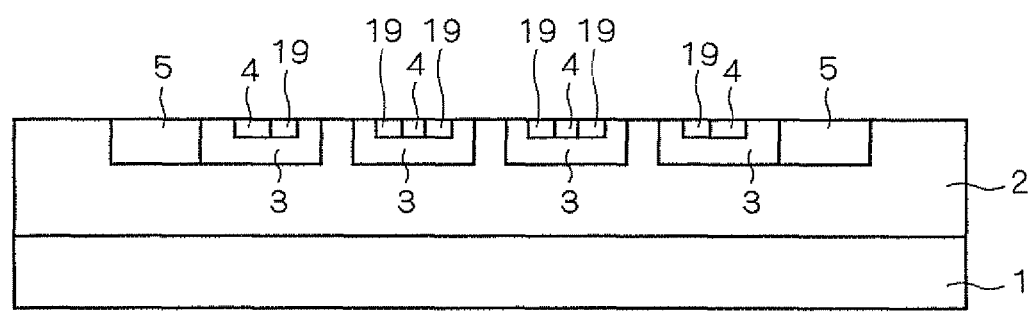
FIG. 13 A cross-sectional view illustrating a process of manufacturing the semiconductor device of the second preferred embodiment.

First, an epitaxial growth using given dopant is applied to the first main surface of the n type SiC substrate 1. Thus, as shown in FIG. 13, the n− type SiC epi-layer (which can be regarded as a SiC region) 2 is formed on the first main surface of the SiC substrate 1.

Next, an ion implantation is applied to given regions of the first main surface of the SiC epi-layer 2. Thus, as shown in FIG. 13, the p type first impurity layers 3 are formed in the given regions in the surface of the SiC epi-layer 2. This ion implantation is conduced while varying the implant energy in a step-by-step manner, e.g. from high to low.

Next, a further ion implantation is applied to the regions where the first impurity layers 3 have been formed. Thus, as shown in FIG. 13, the p+ type ohmic contact regions 4, having a higher concentration than the first impurity layers 3, are formed in the surfaces of the first impurity layers 3. This ion implantation is conducted while varying the implant energy in a step-by-step manner, e.g. from high to low.

Next, a further ion implantation is applied to the regions where the first impurity layers 3 have been formed. Thus, as shown in FIG. 13, the n+ type ion-implanted regions 19 are formed in the surfaces of the first impurity layers 3. As shown in FIG. 13, the ion-implanted regions 19 are formed adjacent to the ohmic contact regions 4. This ion implantation is conducted while varying the implant energy in a step-by-step manner, e.g. from high to low.

Next, an ion implantation is applied to the regions adjacent to the first impurity layers 3. Thus, as shown in FIG. 13, the JTE layers 5 are formed adjacent to the first impurity layers 3

(more specifically, the JTE layers 5 are formed adjacent to the outermost first impurity layers 3 in a horizontal direction in a cross-sectional view).

As mentioned earlier, the JTE layers 5 have p type conductivity. The impurity concentration of the JTE layers 5 is lower than the impurity concentration of the first impurity layers 3. Also, in this preferred embodiment, the JTE layers 5 are formed in the surface of the SiC epi-layer 2 (i.e. the JTE layers 5 are exposed from the surface of the SiC epi-layer 2). Also, the ion implantation for the formation of the JTE layers 5 is conducted while varying the implant energy in a step-by-step manner, e.g. from high to low.

These ion implantation steps are followed by an activating annealing. This electrically activates the impurities that have been ion-implanted in the implantation steps. The activating annealing also restores crystallinity of the ion-implanted regions.

Next, an epitaxial growth using given dopant is applied to the upper surface of the SiC epi-layer 2. Thus, as shown in FIG. 14, an n type SiC epi-film 20 is formed on the SiC epi-layer 2.

Next, a photolithography process is applied to pattern the SiC epi-film 20 into given shape (i.e. to remove given portions of the SiC epi-film 20). Thus, as shown in FIG. 15, the SiC epi-film 20 remains at least on the JTE layers 5 (the remaining portions can be regarded as the n type second impurity layers 25), and the SiC epi-film 20 also remains in given regions (which can be regarded as the n type epi-channel layers 15).

In another method for forming the second impurity layers 25, an n type ion implantation may be applied to the portions of the SiC epi-film 20 that are left at least on the JTE layers 5 so that the impurity concentrations of the second impurity layers 25 and the epi-channels 15 differ from each other.

Figure 14:
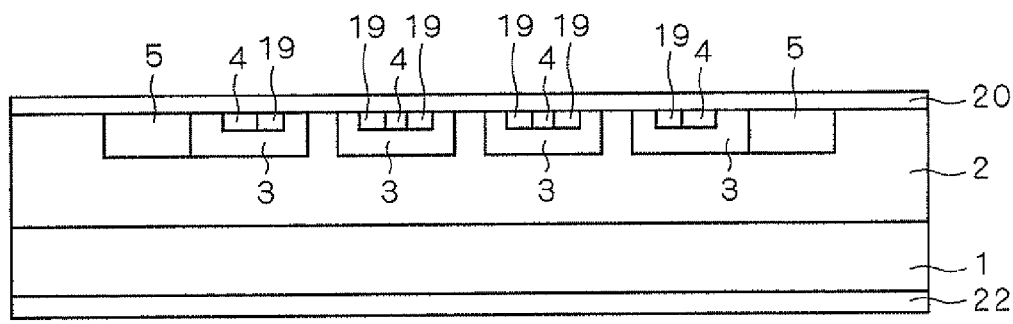
FIG. 14 A cross-sectional view illustrating the process of manufacturing the semiconductor device of the second preferred embodiment.

In still another method for forming the impurity layers 25, a p type Sic epi-film 20 is formed by epitaxial growth as shown in FIG. 14, and an n type ion implantation is applied to the portions of the SiC epi-film 20 that are left at least on the JTE layers 5, so as to form the second impurity layers 25. In this case, the epi-channel layers 15 are p type.

Figure 15:
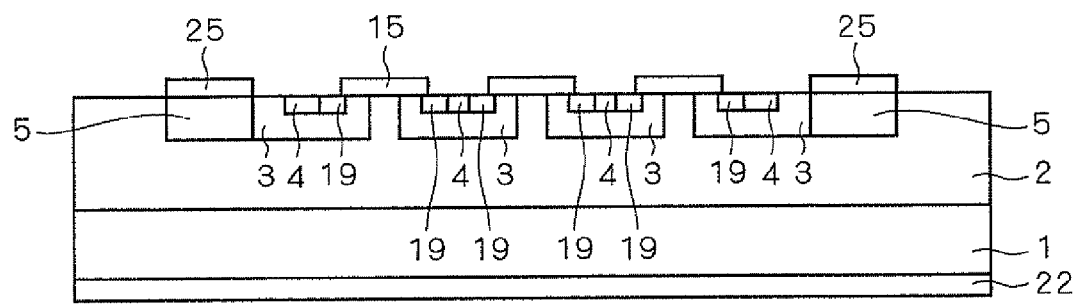
FIG. 15 A cross-sectional view illustrating the process of manufacturing the semiconductor device of the second preferred embodiment.

Next, though not described in detail, the gate insulating films 16, gate electrodes 17, insulating films 18, source electrode 21, drain electrode 22, and protective film 6 (having the opening 29) are formed to the structure shown in FIG. 15.

The semiconductor device of this preferred embodiment is completed through these process steps (FIG. 12).

Thus, in this preferred embodiment, the p type JTE layers 5 are formed in the surface of the n type SiC epi-layer 2. The n type second impurity layers 25 are formed on the p type JTE layers 5. The protective film 6 is formed to cover the second impurity layers 25.

That is, this preferred embodiment also has the nMOS capacitor structure having JTE layers 5 as described in the first preferred embodiment.

Accordingly, the semiconductor device of this preferred embodiment also offers the effect described in the first preferred embodiment. That is, the semiconductor device of this preferred embodiment provides stable dielectric strength, because the JTE layers 5 are hardly affected by the variation of the amount of fixed charges occurring between the JTE layers 5 and the protective film 6, when conditions for the formation of the protective film 6 over the JTE layers 5 are varied, for example.

Also, in the semiconductor device manufacturing method, the epi-channel layers 15 and the second impurity layers 25 are simultaneously formed by removing given portions of the SiC epi-film 20 having n type conductivity.

Accordingly, during the epi-channel MOSFET manufacturing process, the n type second impurity layers 25 can be formed on the p type JTE layers 5 without requiring any extra process step (i.e. an epi-channel MOSFET having an nMOS capacitor structure with JTE layers 5 can be manufactured).

Now, during the formation of the JTE layers 5 (i.e. during the ion implantation for the formation of the JTE layers 5), it is preferable to perform the ion implantation such that the impurity concentration Np and the depth Dp of the JTE layers (which can be regarded as a first JTE layer) 5 satisfy the following condition.

That is, it is preferable to perform the ion implantation such that the condition below is satisfied:

$$Np \times Dp = Npo \times Dpo + Nn \times Dn.$$

Wherein, in the structure shown in FIG. 12, for example, "Npo" is an optimum impurity concentration of the JTE layers (which can be regarded as a second JTE layer) 5 when the second impurity layers 25 are absent and there are no fixed charges between the SiC and protective film. The optimum impurity concentration refers to an impurity concentration that provides a maximum withstanding effect in terms of dielectric strength. "Npo" can be determined by experiment or simulation, for example.

"Dpo" is a depth of the JTE layers (which can be regarded as second JTE layer) 5 when the second impurity layers 25 are absent in the structure shown in FIG. 12, for example. The impurity concentration of the JTE layers 5 in this case is "Npo".

"Nn" is the impurity concentration of the n type second impurity layers 25 formed on the JTE layers (which can be regarded as a first JTE layer) 5 in FIG. 12. "Dn" is the depth (thickness) of the n type second impurity layers 25 on the JTE layers (which can be regarded as first JTE layer) 5 in FIG. 12.

The equation above is derived on the basis of the idea that the optimum amount of carriers of the JTE layers 5 in the absence of the second impurity layers 25 (i.e. Npo×Dpo×Area A) plus the amount of carriers due to the n type second impurity layers 25 (i.e. Nn×Dn×Area A) as p type impurity provides the optimum amount of carriers of the JTE layers 5 of the preferred embodiment (i.e. Np×Dp×Area A). Wherein the Area A is equivalent in the individual terms.

Thus, the JTE layers 5 and the second impurity layers 25 are formed in such a way as to satisfy the equation. This provides the JTE layers 5 with a maximum withstanding effect in terms of dielectric strength. The semiconductor device fabricated under this condition provides a relation nearly equal to that of the equation.

For example, for the manufacture of a semiconductor device (epi-channel MOSFET) with a withstand voltage of 1200 to 1700 V, the ion implantation is preferably conducted such that the components have the values below.

That is, suppose the impurity concentration of the SiC epi-layer 2 is $5 \times 10^{15}$ to $2 \times 10^{16}/cm^3$ and its depth (thickness) is 7 to 15 μm. Also, suppose Npo=$2 \times 10^{17}/cm^3$ and Dpo=0.9 μm. Then, in FIG. 12, suppose the n type second impurity layers 25 are formed with the impurity concentration Nn being $1 \times 10^{15}$ to $3 \times 10^{17}/cm^3$ and its depth Dn being 0.1 to 0.5 μm. The impurity concentration and depth of the epi-channel layers 15 are equivalent to those of the second impurity layers 25.

To design the semiconductor device in this case, it is seen that the ion implantation is to be conducted such that the impurity concentration Np of the JTE layers 5 is 2.0 to $3.67 \times 10^{17}/cm^3$ and its depth (thickness) is 0.9 μm.

The Npo and Dpo can be previously obtained by experiment or simulation, and the Nn, Dn, Np and Dp can be arbitrarily determined within the condition of the equation, according to the semiconductor device to be manufactured and the process. For example, when some terms are severely restricted because of the process or device design, other easier terms can be determined according to the conditional equation.

Also, it is difficult to form the JTE layers 5 with a small product of Np and Dp. Accordingly, when the product of Npo and Dpo is small, for example, the product of Nn and Dn can be set larger. This makes it possible to produce JTE layers 5 with a larger product of Np and Dp, facilitating the formation of the JTE layers 5.

In the above-described another method for forming the second impurity layers 25, i.e. in the method in which an n type ion implantation is applied to the portions of the SiC epi-film 20 that are left at least on the JTE layers 5 so that the impurity concentrations of the second impurity layers 25 and the epi-channel layers 15 differ from each other, the same discussion is viable with the impurity concentration of the n type ion implantation to the SiC epi-film 20 being "Nn1" and its thickness being "Dn1".

That is, it is preferable to perform the ion implantation such that the condition below is satisfied:

$$Np \times Dp = Npo \times Dpo + Nn \times Dn + Nn1 \times Dn1.$$

Also, in the above-described, still another method for forming the second impurity layers 25, i.e. in the method in which a p type SiC epi-film 20 is formed by epitaxial growth as shown in FIG. 14, and an n type ion implantation is applied to the portions of the SiC epi-film 20 that are left at least on the JTE layers 5, so as to form the second impurity layers 25, the same discussion is viable with the impurity concentration of the p type SiC epi-film 20 being "Np1" and its thickness being "Dp1", and with the impurity concentration of the n type ion implantation to the SiC epi-film 20 being "Nn1" and its thickness being "Dn1".

That is, it is preferable to perform the ion implantation such that the condition below is satisfied:

$$Np \times Dp = Npo \times Dpo - Np1 \times Dp1 + Nn1 \times Dn1.$$

Also, when the n type second impurity layers 25 on the p type JTE layers 5 connect to the SiC epi-layer 2, then the n type second impurity layers 25 are at the same potential as the drain electrode 22. Thus, the width of the depletion layers, which extend in the JTE layers 5 when a reverse bias is applied to the device, can be more uniform than when the second impurity layers 25 are not at the same potential as the drain electrode 22. The uniform width depletion layers mean the device has a stable withstand voltage.

This preferred embodiment has described a one-zone JTE structure as the structure of the JTE layers 5, but the same effects are obtained with a multiple-zone JTE structure in which the JTE layers 5 have a concentration distribution step by step from the first impurity layers 3 to the SiC epi-layer 2.

Also, an epi-channel MOSFET has been described as the device structure. However, the structure of the preferred embodiment (i.e., the structure in which the n type second impurity layers 25 exist on the p type JTE layers 5, and the protective film 6 exists on the second impurity layers) is applicable also to devices such as SiC Schottky diodes, SiC pn diodes, etc. that have similar JTE layers 5 as a termination structure.

While the invention has been described in detail, the foregoing description is in all aspects illustrative and not restrictive. It is understood that numerous other modifications and variations can be devised without departing from the scope of the invention.

The invention claimed is:

1. A semiconductor device manufacturing method comprising:
   (A) forming an impurity layer having p type conductivity in a surface of a SiC region having n type conductivity; and
   (B) applying an ion implantation to said SiC region in a region adjacent to said impurity layer, so as to form a first Junction Termination Edge (JTE) layer adjacent to said impurity layer and having a lower impurity concentration than said impurity layer, said step (B) applying said ion implantation at varied energies such that said first JTE layer is formed from a first depth in said SiC region to a second depth that does not reach the surface of said SiC region.

2. The semiconductor device manufacturing method according to claim 1, wherein
   Np is the impurity concentration of said first JTE layer,
   Dp is depth of said first JTE layer in said SiC region,
   Nn is impurity concentration of said SiC region having n type conductivity that is located between said first JTE layer and the surface of said SiC region, and
   Dn is depth of said SiC region having n type conductivity and that is located between said first JTE layer and the surface of said SiC region, and,
   when Npo is optimum impurity concentration in a second JTE layer which reaches the surface of said SiC region, and Dpo is depth of said second JTE layer in said SiC region,
   said method further comprises performing said step (B) so that, $$Np \times Dp = Npo \times Dpo + Nn \times Dn.$$

3. A semiconductor device manufacturing method comprising:
   (A) forming an impurity layer having p type conductivity in a surface of a SiC region having n type conductivity; and
   (B) applying an ion implantation to said SiC region in a region adjacent to said impurity layer, so as to form a first Junction Termination Edge (JTE) layer adjacent to said impurity layer and having a lower impurity concentration than said impurity layer, said step (B) applying said ion implantation at varied energies to effect a p type ion implantation from a first depth in said SiC region to the surface of said SiC region, and then applying said ion implantation at varied energies to effect an n type ion implantation from the surface of said SiC region to a second depth of said SiC region, so as to form said first JTE layer.

4. The semiconductor device manufacturing method according to claim 3, wherein
   Np is the impurity concentration of said first JTE layer,
   Dp is depth of said first JTE layer in said SiC region,
   Nn1 is impurity concentration of a region having n type conductivity that is formed by the ion implantation and that is located on and in contact with said first JTE layer, and
   Dn1 is depth of the region having n type conductivity that is formed by the ion implantation and that is located on and in contact with said first JTE layer, and,
   when Npo is optimum impurity concentration in a second JTE layer which reaches the surface of said SiC region, and Dpo is depth of said second JTE layer within said SiC region, said method further comprises performing said step (B) so that, $$Np \times Dp = Npo \times Dpo + Nn1 \times Dn1.$$

5. A semiconductor device manufacturing method comprising:
   (a) forming a first impurity layer having p type conductivity in a surface of a SiC region having n type conductivity;
   (b) forming a first Junction Termination Edge (JTE) layer adjacent to said first impurity layer in the surface of said SiC region, said first JTE layer having a lower impurity concentration than said first impurity layer;
   (c) applying an epitaxial growth using a given dopant to form an epi-film having n type conductivity on an upper surface of said SiC region; and
   (d) removing a portion of said epi-film such that a second impurity layer having n type conductivity remains at least on said first JTE layer.

6. The semiconductor device manufacturing method according to claim 5, wherein
   Np is the impurity concentration of said first JTE layer,
   Dp is depth of said first JTE layer within said SiC region,
   Nn is impurity concentration of said second impurity layer located on said first JTE layer, and
   Dn is thickness of said second impurity layer located on said first JTE layer, and
   when Npo is optimum impurity concentration of a second JTE layer located where said second impurity layer is absent from said SiC region, and Dpo is thickness of said second JTE layer on said SiC region,
   said method comprises performing said steps (b) and (c) so that $$Np \times Dp = Npo \times Dpo + Nn \times Dn.$$

7. A semiconductor device manufacturing method comprising the:
   (a) forming a first impurity layer having p type conductivity in a surface of a SiC region having n type conductivity;
   (b) forming a first Junction Termination Edge (JTE) layer adjacent to said first impurity layer in the surface of said SiC region, said first JTE layer having a lower impurity concentration than said first impurity layer;
   (c) applying an epitaxial growth using a given dopant to form an epi-film having n type conductivity on an upper surface of said SiC region;
   (d) removing a portion of said epi-film such that a second impurity layer having n type conductivity remains at least on said first JTE layer; and
   (e) applying an n type ion implantation to said second impurity layer.

8. The semiconductor device manufacturing method according to claim 7, wherein
   Np is the impurity concentration of said first JTE layer,
   Dp is depth of said first JTE layer in said SiC region,
   Nn is impurity concentration of said epi-film,
   Dn is thickness of said epi-film,
   Nn1 is concentration of an n type impurity that is ion-implanted in said second impurity layer, and
   Dn1 is depth of the n type impurity that is ion-implanted in said second impurity layer, and,
   when Npo is optimum impurity concentration of a second JTE layer located where said second impurity layer is absent from said SiC region, and Dpo is depth of said second JTE layer within said SiC region,
   said method comprises performing said steps (b), (c), and (e) so that, $$Np \times Dp = Npo \times Dpo + Nn \times Dn + Nn1 \times Dn1.$$

9. A semiconductor device manufacturing method comprising:
   (a) forming a first impurity layer having p type conductivity in a surface of a SiC region having n type conductivity;
   (b) forming a first Junction Termination Edge (JTE) layer adjacent to said first impurity layer in the surface of said SiC region, said first JTE layer having a lower impurity concentration than said first impurity layer;
   (c) applying an epitaxial growth using a given dopant to form an epi-film having p type conductivity on an upper surface of said SiC region;
   (d) removing a portion of said epi-film such that a second impurity layer having p type conductivity remains at least on said first JTE layer; and
   (e) applying an n type ion implantation to said second impurity layer to make said second impurity layer n type.

10. The semiconductor device manufacturing method according to claim 9, wherein
    Np is the impurity concentration of said first JTE layer,
    Dp is depth of said first JTE layer within said SiC region,
    Np1 is impurity concentration of said epi-film having p type conductivity,
    Dp1 is thickness of said epi-film having p type conductivity.,
    Nn1 is concentration of an n type impurity that is ion-implanted in said second impurity layer, and
    Dn1 is depth of the n type impurity that is ion-implanted in said second impurity layer, and,
    when Npo is optimum impurity concentration of a second JTE layer located where said second impurity layer is absent from said SiC region, and Dpo is depth of said second JTE layer,
    said method comprises performing said steps (b), (c), and (e) so that, $$Np \times Dp = Npo \times Dpo - Np1 \times Dp1 + Nn1 \times Dn1.$$

* * * * *